United States Patent
Roy et al.

(10) Patent No.: US 9,847,127 B1
(45) Date of Patent: Dec. 19, 2017

(54) RESISTIVE NON-VOLATILE MEMORY AND A METHOD FOR SENSING A MEMORY CELL IN A RESISTIVE NON-VOLATILE MEMORY

(71) Applicant: NXP USA, INC., Austin, TX (US)

(72) Inventors: Anirban Roy, Austin, TX (US); Michael A. Sadd, Austin, TX (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/356,877

(22) Filed: Nov. 21, 2016

(51) Int. Cl.
| | |
|---|---|
| *G11C 11/00* | (2006.01) |
| *G11C 13/00* | (2006.01) |
| *G11C 11/16* | (2006.01) |
| *G11C 11/4091* | (2006.01) |

(52) U.S. Cl.
CPC ........ *G11C 13/004* (2013.01); *G11C 13/0026* (2013.01); *G11C 13/0028* (2013.01); *G11C 13/0038* (2013.01); *G11C 11/1673* (2013.01); *G11C 11/4091* (2013.01); *G11C 2013/005* (2013.01)

(58) Field of Classification Search
CPC ............ G11C 11/4091; G11C 11/1673; G11C 2013/005
USPC ................ 365/148, 207, 205, 189.07, 185.21
See application file for complete search history.

(56) References Cited

U.S. PATENT DOCUMENTS

| | | | |
|---|---|---|---|
| 6,191,989 B1 | 2/2001 | Luk et al. | |
| 7,764,536 B2 * | 7/2010 | Luo | G11C 11/16 365/148 |
| 8,027,206 B2 | 9/2011 | Yoon et al. | |
| 8,194,439 B2 | 6/2012 | Kim et al. | |
| 8,509,003 B2 | 8/2013 | Lin et al. | |
| 8,687,412 B2 | 4/2014 | Chih et al. | |
| 9,659,623 B1 * | 5/2017 | Sadd | G11C 11/1673 |
| 2011/0037708 A1 * | 2/2011 | Yang | G06F 3/044 345/173 |
| 2011/0122674 A1 | 5/2011 | Lin et al. | |
| 2014/0211550 A1 | 7/2014 | Sun et al. | |
| 2015/0294706 A1 * | 10/2015 | Bonaccio | G11C 11/1673 365/158 |

OTHER PUBLICATIONS

Aoki, M. et al., "A Novel Voltage Sensing 1T/2MTJ Cell with Resistance Ratio for Highly Stable and Scalable MRAM", 2005 Symposium on VLSI Circuits Digest of Technical Papers, Jun. 2005, pp. 170-171.

(Continued)

*Primary Examiner* — Connie Yoha

(57) ABSTRACT

A memory device includes a sense amplifier coupled to a first read voltage during a first phase of a read operation and a second read voltage during a second phase of the read operation. A first and second bias voltages are based on the first and second read voltages and corresponding current on a bit line. A first capacitor includes a terminal coupled to the first and second bias voltages. A first amplifier includes an input coupled to another terminal of the first capacitor and another input coupled to a common mode voltage during the first phase and to a reference voltage during the second phase. A second capacitor includes a terminal coupled to an output of the first amplifier. A second amplifier includes an inverting input coupled to another terminal of the second capacitor and another input coupled to a common mode voltage.

20 Claims, 5 Drawing Sheets

(56) References Cited

OTHER PUBLICATIONS

Chen, Y. et al., A Nondestructive Self-Reference Scheme for Spin-Transfer Torque Random Access Memory (STT-RAM), Design, Automation & Test in Europe Conference & Exhibition (Date), 2010, 6 pages.
Huang, K. et al., "Optimization Scheme to Minimize Reference Resistance Distribution of Spin-Transfer-Torque MRAM", IEEE Transactions on Very Large Scale Integration (VLSI) Systems, vol. 22, No. 5, May 2014, pp. 1179-1182.
Na, T. et al., "Reference-Scheme Study and Novel Reference Scheme for Deep Submicrometer STT-RAM", IEEE Transactions on Circuits and Systems I: Regular Papers, vol. 16, Issue 12, 2014, pp. 1-10.
Smullen, C., "Designing Giga-scale Memory Systems with STT-RAM", http://www.cs.virginia.edu/~gurumurthi/student_theses/Clint_Smullen_PhD.pdf, 2011, 158 pages.
Tsuchida, K. et al., "A 64Mb MRAM with Clamped-Reference and Adequate-Reference Schemes", 2010 IEEE International Solid-State Circuits Conference, pp. 258-260.
Xu, W. et al., "Design of Spin-Torque Transfer Magnetoresistive RAM and CAM/TCAM with High Sensing and Search Speed", IEEE Transactions on Very Large Scale Integration (VLSI) Systems, vol. 18, No. 1, Jan. 2010, pp. 66-74.
Yu, H. et al, "New Circuit Design Architecture for a 300-MHz 40nm 1 Mb Embedded STT-MRAM with Great Immunity to PVT Variation", 2012 International Conference on Solid-State and Integrated Circuit (ICSIC 2012), http://www.ipcsit.com/vol32/011-ICSIC2012-D2001.pdf, vol. 32, 5 pages.
Zhang, L. et al., "Design and analysis of the reference cells for STT-MRAM", IEICE Electronics Express, vol. 10, No. 12, pp. 1-6.

\* cited by examiner

RESISTIVE NON-VOLATILE MEMORY AND A METHOD FOR SENSING A MEMORY CELL IN A RESISTIVE NON-VOLATILE MEMORY

BACKGROUND

Field

This disclosure relates generally to resistive non-volatile memories, and more specifically, to sensing a memory cell in a resistive non-volatile memory.

Related Art

Resistive memories are commonly used as non-volatile memories (NVMs). Reading data stored in such memories is accomplished by sensing differences in resistance in a resistive element of a memory cell between two states, a high resistive state (HRS) and a low resistive state (LRS). In one sensing scheme used today, the stored state of a memory cell can be determined by comparing the cell state to that of a reference cell. However, the difference in resistance between a high state and a low state can be very small, requiring a sense amplifier with high sensitivity. In another sensing scheme used today, differential sensing is used which requires each memory cell to use two sense transistors and two resistive elements to store a memory state. However, this increases the size of the memory. Therefore, a need exists for an improved sensing scheme for a resistive NVM.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In a resistive memory, a reference-less sensing scheme is implemented using a self-reference technique, without the need for differential sensing or reference cell enabled sensing. One type of resistive element for a memory cell is a resistive random access memory (RRAM) resistive element. An RRAM resistive element has a higher resistive ratio between an HRS and a LRS as compared to other resistive elements, like magnetic tunnel junction (MTJ) elements. With an RRAM memory cell, the current-voltage (I-V) behavior of the resistive element can be used to differentiate between an LRS and an HRS. As will be described below, the current through the cell (Icell) is a stronger function of the bit line voltage (VBL) for the HRS than the LRS. A self-reference scheme can be performed in which a read operation can be performed using two different bit line voltages where the ratio of the two resulting cell currents sensed using a subthreshold region of a sense transistor is used to determine the state. Note that the self-reference technique described herein can apply to different types of RRAM memory cells.

Figure 1:
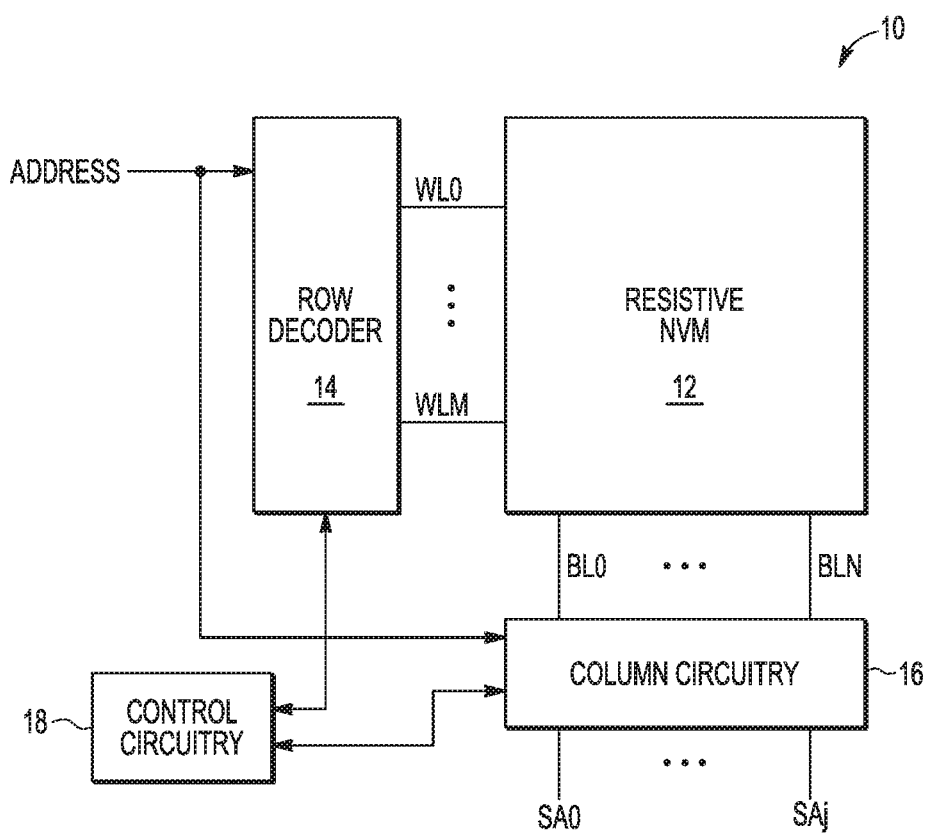
FIG. 1 illustrates, in block diagram form, a memory in accordance with one embodiment of the present invention.

FIG. 1 illustrates a memory 10 in accordance with one embodiment of the present invention. Memory 10 is formed in one or more integrated circuits. Memory 10 includes a resistive NVM array 12, a row decoder 14, column circuitry 16, and control circuitry 18. Array 12 includes M+1 word lines, WL0-WLM, and N+1 bit lines, BL0-BLN. Row decoder 14 is coupled to the M+1 word lines, and columns circuitry 16 is coupled to the N+1 bit lines. Control circuitry 18 is coupled to row decoder 14 and column circuitry 16. An access address for a read or write access is provided to row decoder 14 and to column circuitry 16. In response to a read request, row decoder 14 asserts the selected word line based on a first portion of the access address, and column circuitry 16 accesses the selected bit lines based on a second portion of the access address, and column circuitry 16 outputs j sense amplifier outputs, SA0-SAj. Control circuitry 18 provides the appropriate control signals, as needed, to row decoder 14 and columns circuitry 16 to perform read and write operations, as known in the art. Note that FIG. 1 is not a complete diagram with all elements of memory 10. Only those elements needed to understand the described embodiments are included. For example, data signals and other control signals can be received by memory 10 and other circuitry may be included in addition to the row decoder, column circuitry, and control circuitry. However, the embodiments described herein relate to read operations of memory 10, therefore, circuitry related to a write operation will not be discussed herein.

Figure 2:
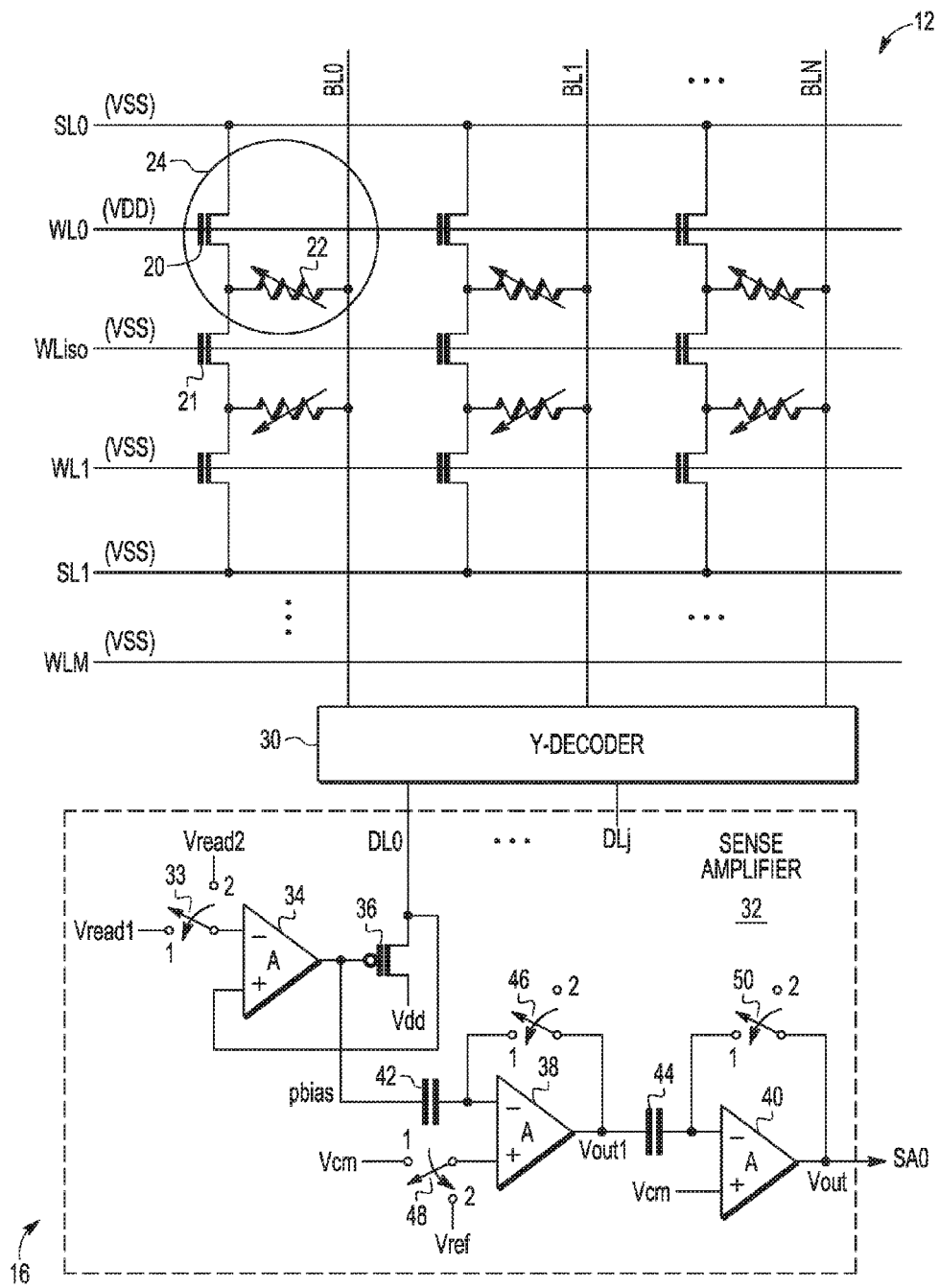
FIG. 2 illustrates, in partial schematic form and partial block diagram form, a more detailed view of the memory array and column circuitry of FIG. 1, in accordance with one embodiment of the present invention.

FIG. 2 illustrates a more detailed view of memory array 12 and column circuitry 16. At the intersection of each word line and bit line is a resistive memory cell. Each resistive memory cell includes a resistive element and a select transistor, and is coupled to a corresponding bit line, word line, and source line. For example, memory cell 24 includes a select transistor 20 and a resistive element 22. A first current electrode of transistor 20 is coupled to a corresponding source line SL0, a control electrode is coupled to a corresponding word line, WL0, and a second control electrode is coupled to a first terminal of resistive element 22. A second terminal of resistive element 22 is coupled to a corresponding bit line, BL0. Between select transistors of adjacent rows, is an isolation transistor having a control electrode coupled to a corresponding word line isolation signal. For example, an isolation transistor 21 is coupled between transistor 20 and the select transistor of the adjacent memory cell in the adjacent row coupled to WL1 and SL1. Isolation transistor 21 has a first current electrode coupled to the second current electrode of transistor 20, a current electrode coupled to a corresponding word line isolation signal, WLiso, and a second current electrode coupled to a first current electrode of the select transistor of the adjacent memory cell. In the illustrated example, bit cell 24 is selected for reading by asserting or activating WL0 (placing WL0 to VDD). All source lines, including SL0 and SL1, WLiso lines, and non-selected word lines, including WL1-WLM, are all at VSS (e.g. ground).

Column circuitry 16, coupled to array 12, includes Y-decoder circuitry 30 and a sense amplifier 32 coupled to Y-decoder 30. Y-decoder 30 is coupled to BL0-BLN and outputs data lines, DL0-DLj. Y-decoder 30, based on the access address, couples one of a selected group of bit lines to a corresponding data line. For example, with an access address, a group of bit lines, such as BL0-BL3, may be selected, and Y-decoder, based on a portion of the access address, couples one of BL0-BL3 to DL0.

Column circuitry 16 also includes j sense amplifiers, with one sense amplifier coupled to each data line DL0-DLj, and outputting SA0-SAj, respectively. Sense amplifier 32 is one of the j sense amplifiers and is coupled to DL0 and outputs SA0. The other sense amplifiers include analogous circuitry to sense amplifier 32. Sense amplifier 32 includes a sense transistor 36, amplifiers 34, 38, and 40, capacitors 42 and 44, and switches 33, 46, 48, and 50. Switch 33 has a first terminal coupled to receive a first voltage source, Vread1, a second terminal coupled to receive a second voltage source, Vread2, and third terminal coupled to an inverting input of amplifier 34. In a first position, switch 33 couples Vread1 to the inverting input of amplifier 34, and in a second position, switch 33 coupled Vread2 to the inverting input of amplifier 34. Transistor 36 has a first current electrode coupled to DL0, a control electrode coupled to an output of amplifier 34, and a second current electrode coupled to VDD. In the illustrated embodiment, transistor 36 is a p-type transistor. The first current electrode of transistor 36 is also coupled to a noninverting input of amplifier 34.

The output of amplifier 34 is coupled to a first terminal of capacitor 42 and provides a bias voltage, pbias. A second terminal of capacitor 42 is coupled to an inverting input of amplifier 38. Switch 46 has a first terminal coupled to the inverting input of amplifier 38, a second terminal coupled to an output of amplifier 38, Vout1. In a first position, switch 46 coupled the second terminal of capacitor 42 to the output of amplifier 38, forcing gain unity on amplifier 38, and in a second position, switch 46 decoupled the second terminal of capacitor 42 from the output of amplifier 38. Switch 48 has a first terminal coupled to receive a common mode voltage, Vcm, a second terminal coupled to receive a global reference voltage, Vref, and a third terminal coupled to a non-inverting input of amplifier 38. In a first position, switch 48 couples Vcm to the noninverting input of amplifier 38, and in a second position, switch 48 couples Vref to the noninverting input of amplifier 38. The output of amplifier 38 is coupled to a first terminal of capacitor 44, and a second terminal of capacitor 44 is coupled to an inverting input of amplifier 40. Switch 50 has a first terminal coupled to the second terminal of capacitor 44 and a second terminal coupled to an output of amplifier 40. In a first position, switch 50 couples the second terminal of capacitor 44 to the output of amplifier 40, forcing gain unity on amplifier 40. In a second position, switch 50 decouples the second terminal of capacitor 44 from the output of amplifier 40. A noninverting input of amplifier 40 is coupled to Vcm. Operation of memory array 12 and column circuitry 16 will be described in reference to FIGS. 3-6 below. A three terminal switch (for example, switches 33 and 48) may be implemented with a pair of two terminal switches. Each two terminal switch may be implemented as a transistor or pass gate.

Figure 3:
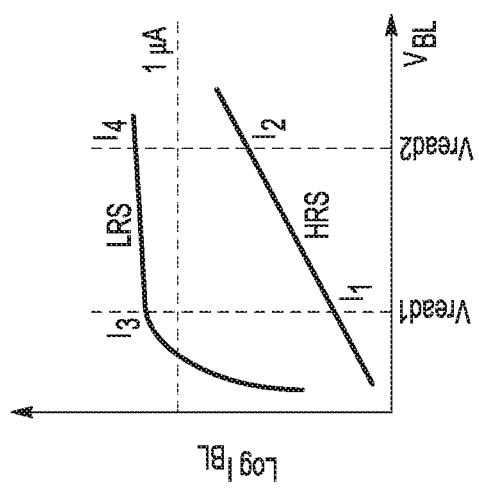
FIG. 3 illustrates a I-V curves for a resistive non-volatile (NV) memory device, in accordance with one embodiment of the present invention.

FIG. 3 illustrates the different I-V curves for an RRAM memory device (also referred to as an RRAM memory cell) to differentiate between LRS and HRS states. The X-axis represents the voltage on a bit line (VBL) and the Y-axis represents the log of the current of the bit line (Log IBL), through the RRAM resistive element. Note that the current of the bit line is a stronger function of voltage on the bit line for the HRS state than the LRS state. However, since the two states have a different I-V curves, this information can be used to differentiate between the two states. At two different voltage points, Vread1 and Vread2, note that the HRS curve results in currents 11 and 12, respectively, and the LRS curve results in currents 13 and 14 respectively. The current ratios 12:11 and 14:13 are different between the two states. The voltages Vread1 and Vread2 can be selected to give particular current readings along the respective 1-V curves.

Figure 4:
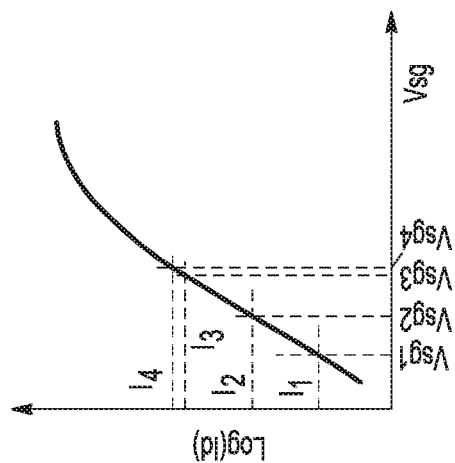
FIG. 4 illustrates an I-V curve for a sense transistor of the column circuitry of FIG. 2, in accordance with one embodiment of the present invention.

FIG. 4 illustrates an I-V curve for sense transistor 36 in sense amplifier 32. The x-axis represents the source to gate voltage (Vsg) on the transistor and the Y-axis represents the log of the current through the transistor. Note that all four current readings discussed in reference to FIG. 3 result in different corresponding Vsg readings, Vsg1, Vsg2, Vsg3, and Vsg4, respectively. Read voltages can be selected such that all four current readings 11-14 occur in the subthreshold region of transistor 36. This provides the most difference between resulting current readings, such as compared to the saturation region of the curve. Therefore, when transistor 36 operates in its subthreshold region, the difference between Vsg1 and Vsg2 can be used to indicate an HRS state of the resistive element of the bit cell and the difference between Vsg3 and Vsg4, which is smaller, can be used to indicate an LRS state of the resistive element of the bit cell. Therefore, a self referencing scheme with a read operation performed at two different voltages, Vread1 and Vread2, can be used to determine the memory state of the bit cell. The ratio of resulting currents of the cell using the subthreshold region of sense transistor 36 can be used to indicate an LRS or HRS. This will be further described in reference to FIGS. 5 and 6 which correspond to the operation of the sense amplifier of FIG. 2.

Figure 5:
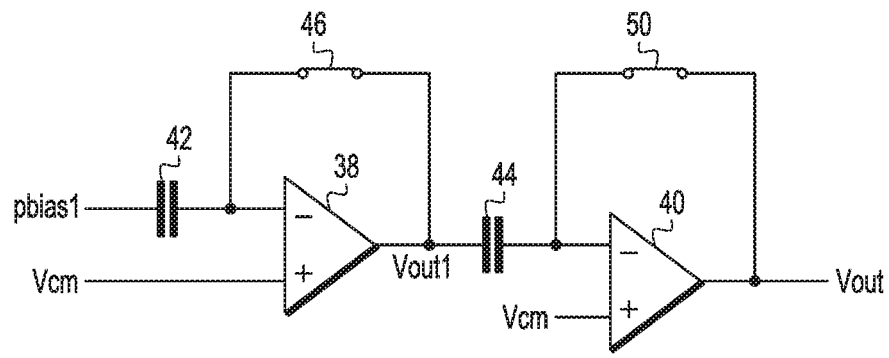
FIG. 5 illustrates, in schematic form, a portion of the sense amplifier of FIG. 2 during a calibration phase, in accordance with one embodiment of the present invention.
Figure 6:
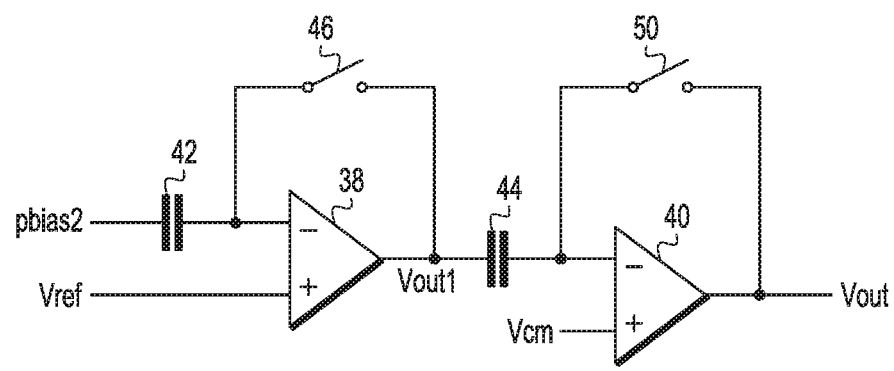
FIG. 6 illustrates, in schematic form, the portion of the sense amplifier of FIG. 5 during a sense phase, in accordance with one embodiment of the present invention.

FIG. 5 shows a portion of sense amplifier 32 with the switches in position 1, which corresponds to a calibration phase of the sense amplifier (also referred to as a first mode). In the current example, it is assumed that BL0 is the selected bit line that is coupled by Y-decoder 30 to DL0. With the switches in position 1, the voltage Vread1 is forced onto the inverting input of differential amplifier 34 and the voltage on the selected bit line, BL0, is provided to the non-inverting input. Based on these voltages, amplifier 34 controls the voltage on the control electrode of transistor 36. Therefore amplifier 34 and transistor 36 acts as a regulator attempting to set BL0 to Vread1. This results in a current, Iread1, on the selected bit line (BL0) which is provided through transistor 36. This current, Iread1, gets converted to a first bias voltage, pbias1, and provided to the first terminal of capacitor 42. The voltage, pbias1, charges capacitor 42. With the switches in position 1, the output of amplifier 38, Vout, is provided to the inverting input, and Vcm is provided to the non-inverting input, such that amplifier 38 is in unity gain mode. This allows the offsets to be nullified during this calibration phase. Then, at the end of the calibration phase, the switches get moved to position 2, as shown in FIG. 6.

With the switches in position 2, which begins the sense phase (also referred to as a second mode), Vread2 is now forced onto the inverting input of amplifier 34. The selected bit line, BL0, provides the resulting current, Iread2, through transistor 36. This current, Iread2, gets converted by transistor 36 to a second bias voltage, pbias2, at the control electrode of transistor 36. Since capacitor 42 was previously charged with pbias1 and the Vcm was placed onto the inverting input in the calibration phase (by switch 46 which coupled the inverting input to Vout), the resulting voltage at the inverting input of amplifier 38 is Vcm+pbias2−pbias1. This voltage gets compared to a reference voltage, Vref. Vref is chosen such that when resistive element 22 is in a HRS, the inverting input is less than Vref and when resistive element 22 is in a LRS, the inverting input is greater than Vref.

Since Vread1 and Vread2, which result in Iread1 and Iread2, respectively, are selected such that transistor 36 operates in its subthreshold region, the difference between pbias2 and pbias1 can be used to determine the state of the resistive element. If the resistive element is in an HRS, then pbias2−pbias1 gives a first value in a first range and when resistive element is in an LRS, then pbias2−pbias1 gives a second value in a second range that is different from the first range. Therefore, an estimate can be determined for pbias2−pbias1 for an HRS element and an estimate can be determined for pbias2−pbias1 for an LRS element. In one embodiment, to be able to detect the difference between and HRS and LRS, Vref may be set to Vcm+(average between the pbias2−pbias1 estimate for the HRS and the pbias2−pbias1 for the LRS). Therefore, at amplifier 38, Vcm+pbias2−pbias1 is compared with Vcm+(((pbias2−pbias1 estimate for HRS)+(pbias2−pbias1 estimate for LRS))/2). Therefore, when pbias2−pbias1 is greater than ((pbias2−pbias1 estimate for HRS)+(pbias2−pbias1 estimate for LRS))/2, Vout1 at the output of amplifier 38 approaches a logic level 0, and when it is not greater, Vout1 approaches a logic level 1.

Since Vout1 is a small signal, capacitor 44 and amplifier 40 provide another amplification stage, with the common mode voltage Vcm, to amplify Vout1 as Vout. At some time after Vout reaches its final value at the end of the sense phase, Vout provides the logic output corresponding to the logic value stored by resistive element 22. For example, in the example used above, a resistive element being in an HRS causes Vout to be a logic level 0 at the end of the sense phase and the resistive element being in a LRS causes Vout to be a logic level 1 at the end of the sense phase. In sense amplifier 32, Vout provides the logic output SA0.

Note that in other embodiments, an element in an HRS can cause Vout to be a logic level 1 and LRS can cause Vout to be a logic level 0. Also, an n-type transistor rather than a p-type transistor may be used for transistor 36 as the current to voltage converter. In FIG. 2, the illustrated portion of sense amplifier 32 is coupled to DL0 and provides SA0. Column circuitry 16 includes j sense amplifiers, analogous to sense amplifier 32, coupled to each data line, DL0-DLj, and each sense amplifier would operate as described above, depending on the selected bit line, and output the corresponding one of SA0-SAj.

Figure 7:
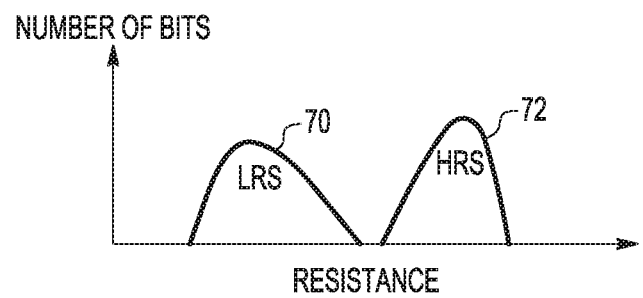
FIGS. 7 and 8 illustrate example bit distributions for the array of FIG. 2, in accordance with various examples of the present invention.
Figure 8:
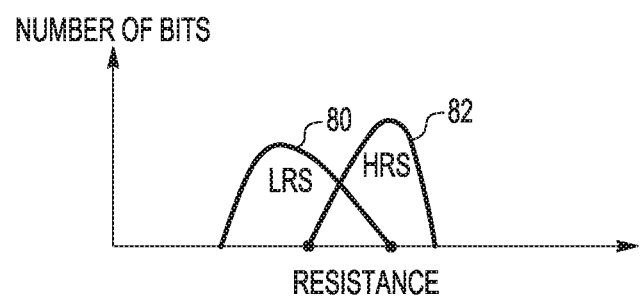

FIG. 7 illustrates an example in which the bit distribution of array 12 of LRS programmed bit cells is curve 70 and the bit distribution of array 12 of HRS programmed bit cells is curve 72. In this case, the curves are non-overlapping such that a bit in the LRS will not be mistakenly read as being in a HRS and vice versa. FIG. 8 illustrates an example in which the bit distribution of array 12 of LRS programmed bit cells is curve 80 and the bit distribution of array 12 of HRS programmed bit cells is curve 82. In this case, the curves are actually overlapping such that using prior art sensing methods, a bit in one distribution can be mistakenly read as being the wrong state. For example, the black dot along curve 82 may be mistakenly read as a bit programmed to HRS rather than LRS. Likewise, the black dot along curve 82 may be mistakenly read as a bit programmed to LRS rather than HRS. However, using the methods and circuits described above, the resistive state can correctly be determined regardless of whether the distributions overlap or not. The detection of a bit in a particular state is performed by taking two current readings (Iread1 and Iread2) using the same selected bit cell in the subthreshold region of the sense transistor (e.g. transistor 36). Therefore, multiple readings are taken from a same resistive element to determine the state without requiring comparison to a second resistive element, such as a reference cell. This self-referencing scheme allows for more accurate readings, even with overlapping distributions.

Therefore, by now it can be understood how a self-referencing scheme can be used for a memory cell read operation. For example, a read operation can be performed using two different bit line voltages where the ratio of the two resulting cell currents is sensed using a subthreshold region of a sense transistor to determine the state of the cell. This may allow for improved sensing, even in the case of overlapping bit distributions. Again, although the self-referencing technique is described in reference to an RRAM memory cell, the technique can apply to any type of resistive element memory cell.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or an asterix (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

In one embodiment, the illustrated elements of memory 10 are circuitry located on a single integrated circuit or within a same device. Memory 10 may be included in a larger integrated circuit with other circuitry, such as one or more processors, or may be packaged with in a system-on-chip (SoC) device.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. For example, more or fewer amplification stages may be used in each sense amplifier. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

In one embodiment, an integrated circuit includes an array of resistive non-volatile memory cells; column circuitry coupled to columns of the programmable resistive memory cells by bit lines; a sense amplifier coupled to a column decoder by data lines, wherein the sense amplifier includes: a first input configured to switch between first and second read voltages; a current to voltage converter configured to convert current on one of the data lines to a data voltage corresponding to the current; a first capacitor including a first terminal coupled to a bias signal (pbias) representing the data voltage, and a second terminal; a second amplifier including: an inverting input coupled to: the second terminal of the first capacitor and to an output of the second amplifier during a first mode; the second terminal of the first capacitor during a second mode, and a non-inverting input coupled to: a common mode voltage during the first mode, and a reference voltage during the second mode; a second capacitor including a first terminal coupled to the output of second amplifier, and a second terminal; and a third amplifier including: an inverting input coupled to: the second terminal of the second capacitor and to an output of the third amplifier during the first mode; the second terminal of the second capacitor during the second mode, and a non-inverting input coupled to the common mode voltage. In one aspect, the integrated circuit further includes control circuitry configured to switch the first input of the sense amplifier to the first read voltage during the first mode and to the second read voltage during the second mode. In another aspect, an output of the third amplifier is an output of the sense amplifier during the second mode. In another aspect, the first and second read voltages are in a subthreshold voltage region of the current to voltage converter. In a further aspect, the current to voltage converter is a metal oxide semiconductor transistor. In another aspect, the integrated circuit further includes a first amplifier configured with an inverting input coupled to the first input of the sense amplifier and a non-inverting input coupled to the data voltage to generate the bias signal representing a logarithm of current on the one of the data lines. In another aspect, the integrated circuit further includes row decoder circuitry coupled to rows of the array of resistive non-volatile memory cells by word lines. In another aspect, the memory cells include a resistive random access memory element as a resistive memory storage element. In another aspect, the reference voltage is the common mode voltage plus an average between an expected change of the bias signal between the first mode and the second mode for a high resistance state of the memory cells and an expected change of the bias signal between the first mode and the second mode for a low resistance state of the memory cells.

Another embodiment includes a method of reading data stored in a resistive non-volatile memory cell, in which the method includes during a first phase of a read operation, applying a first read voltage to a bit line coupled to the memory cell; charging a first plate of a first capacitor to a first bias voltage signal representing a non-linear function of current on the bit line; charging a first plate of a second capacitor to a common mode voltage; and during a second phase of a read operation, applying a second read voltage to the bit line coupled to the memory cell; charging the first plate of the first capacitor to a second bias voltage signal representing the non-linear function of current on the bit line; charging the first plate of the second capacitor to an amplified difference between a reference voltage and a difference between voltage on the first plate of the first capacitor during the first phase and voltage on the first plate of the first capacitor during the second phase; amplifying voltage at a second plate of the second capacitor to generate a sense amplifier output signal. In one aspect of the another embodiment, the reference voltage is the common mode voltage plus an average between an expected change of the first and second bias voltage signals between the first phase and the second phase for a high resistance state of the memory cell and an expected change of the first and second bias voltage signals between the first phase and the second phase for a low resistance state of the memory cell. In another aspect, the memory cell includes a resistive random access memory element as a resistive memory storage element. In another aspect, the method further includes applying the first and second read voltages to the bit line through a gate electrode of a transistor, wherein the transistor includes a first current electrode coupled to the bit line. In a further aspect, the method further includes generating the first and second bias voltage signals with a first amplifier having: an inverting input coupled to the first read voltage during the first phase of the read operation and to the second read voltage during the second phase of the read operation, a non-inverting input coupled to the bit line, an output coupled to the gate electrode of the transistor. In another further aspect, the method further includes generating an amplified difference between the reference voltage and the combination of output voltage of the first capacitor coupled to input voltage to the second capacitor with a second amplifier having: an inverting input coupled to the first bias voltage during the first phase of the read operation and to the second bias voltage during the second phase of the read operation, a non-inverting input coupled to the common mode voltage during the first phase of the read operation and to the reference voltage during the second phase of the read operation, an output coupled to the input of the second capacitor. In another aspect, the first and second read voltages are in a subthreshold voltage region of the transistor. In a further aspect, the first read voltage is proportional to a logarithm of a first-resistance state current required to read the memory cell and the second read voltage is proportional to a logarithm of a second-resistance state current required to read the memory cell. In another aspect, the second resistance state current is greater than the first resistance state current.

Yet another embodiment includes a memory device which includes a sense amplifier including: an input coupled to: a first read voltage during a first phase of a read operation of a memory cell; a second read voltage during a second phase of a read operation of a memory cell, wherein the first read voltage is different than the second read voltage; bias circuitry configured to apply the first and second read voltages to a bit line coupled to a column of memory cells in the memory device and to output a first bias voltage based on the first read voltage and associated current on the bit line and a second bias voltage based on the second read voltage and associated current on the bit line; a first capacitor including a first terminal coupled to output of the bias circuitry and a second terminal; a first amplifier including an inverting input coupled to the second terminal of the first capacitor and a non-inverting input coupled to a common mode voltage during the first phase of the read operation and to a reference voltage during the second phase of the read operation; a second capacitor including a first terminal coupled to an output of the first amplifier and a second terminal; a second amplifier including an inverting input coupled to the second terminal of the second capacitor and a non-inverting input coupled to a common mode voltage. In one aspect, the second terminal of the first capacitor is also coupled to the output of the first amplifier only during the first phase of the read operation; and the second terminal of the second capacitor is also coupled to the output of the second amplifier only during the first phase of the read operation.

What is claimed is:

1. An integrated circuit, comprising:
an array of resistive non-volatile memory cells;
column circuitry coupled to columns of the programmable resistive memory cells by bit lines;
a sense amplifier coupled to a column decoder by data lines, wherein the sense amplifier includes:
a first input configured to switch between first and second read voltages;
a current to voltage converter configured to convert current on one of the data lines to a data voltage corresponding to the current;
a first capacitor including a first terminal coupled to a bias signal (pbias) representing the data voltage, and a second terminal;
a second amplifier including:
an inverting input coupled to:
the second terminal of the first capacitor and to an output of the second amplifier during a first mode;
the second terminal of the first capacitor during a second mode, and
a non-inverting input coupled to:
a common mode voltage during the first mode, and
a reference voltage during the second mode;
a second capacitor including a first terminal coupled to the output of second amplifier, and a second terminal; and
a third amplifier including:
an inverting input coupled to:
the second terminal of the second capacitor and to an output of the third amplifier during the first mode;
the second terminal of the second capacitor during the second mode, and
a non-inverting input coupled to the common mode voltage.

2. The integrated circuit of claim 1, further comprising:
control circuitry configured to switch the first input of the sense amplifier to the first read voltage during the first mode and to the second read voltage during the second mode.

3. The integrated circuit of claim 1, wherein an output of the third amplifier is an output of the sense amplifier during the second mode.

4. The integrated circuit of claim 1, wherein the first and second read voltages are in a subthreshold voltage region of the current to voltage converter.

5. The integrated circuit of claim 4, wherein the current to voltage converter is a metal oxide semiconductor transistor.

6. The integrated circuit of claim 1, further comprising:
a first amplifier configured with an inverting input coupled to the first input of the sense amplifier and a non-inverting input coupled to the data voltage to generate the bias signal representing a logarithm of current on the one of the data lines.

7. The integrated circuit of claim 1, further comprising:
row decoder circuitry coupled to rows of the array of resistive non-volatile memory cells by word lines.

8. The integrated circuit of claim 1, wherein the memory cells include a resistive random access memory element as a resistive memory storage element.

9. The integrated circuit of claim 1, wherein the reference voltage is the common mode voltage plus an average between an expected change of the bias signal between the first mode and the second mode for a high resistance state of the memory cells and an expected change of the bias signal between the first mode and the second mode for a low resistance state of the memory cells.

10. A method of reading data stored in a resistive non-volatile memory cell, comprising:
during a first phase of a read operation,
applying a first read voltage to a bit line coupled to the memory cell;
charging a first plate of a first capacitor to a first bias voltage signal representing a non-linear function of current on the bit line;
charging a first plate of a second capacitor to a common mode voltage; and
during a second phase of a read operation,
applying a second read voltage to the bit line coupled to the memory cell;
charging the first plate of the first capacitor to a second bias voltage signal representing the non-linear function of current on the bit line;
charging the first plate of the second capacitor to an amplified difference between a reference voltage and a difference between voltage on the first plate of the first capacitor during the first phase and voltage on the first plate of the first capacitor during the second phase;

amplifying voltage at a second plate of the second capacitor to generate a sense amplifier output signal.

11. The method of claim 10, wherein the reference voltage is the common mode voltage plus an average between an expected change of the first and second bias voltage signals between the first phase and the second phase for a high resistance state of the memory cell and an expected change of the first and second bias voltage signals between the first phase and the second phase for a low resistance state of the memory cell.

12. The method of claim 10, wherein the memory cell includes a resistive random access memory element as a resistive memory storage element.

13. The method of claim 10, further comprising:
applying the first and second read voltages to the bit line through a gate electrode of a transistor, wherein the transistor includes a first current electrode coupled to the bit line.

14. The method of claim 13, further comprising:
generating the first and second bias voltage signals with a first amplifier having:
an inverting input coupled to the first read voltage during the first phase of the read operation and to the second read voltage during the second phase of the read operation,
a non-inverting input coupled to the bit line,
an output coupled to the gate electrode of the transistor.

15. The method of claim 14, further comprising:
generating an amplified difference between the reference voltage and the combination of output voltage of the first capacitor coupled to input voltage to the second capacitor with a second amplifier having:
an inverting input coupled to the first bias voltage during the first phase of the read operation and to the second bias voltage during the second phase of the read operation,
a non-inverting input coupled to the common mode voltage during the first phase of the read operation and to the reference voltage during the second phase of the read operation,
an output coupled to the input of the second capacitor.

16. The method of claim 13, wherein the first and second read voltages are in a subthreshold voltage region of the transistor.

17. The method of claim 16, wherein the first read voltage is proportional to a logarithm of a first-resistance state current required to read the memory cell and the second read voltage is proportional to a logarithm of a second-resistance state current required to read the memory cell.

18. The method claim 14, wherein the second resistance state current is greater than the first resistance state current.

19. A memory device, comprising:
a sense amplifier including:
an input coupled to:
a first read voltage during a first phase of a read operation of a memory cell;
a second read voltage during a second phase of a read operation of a memory cell, wherein the first read voltage is different than the second read voltage;
bias circuitry configured to apply the first and second read voltages to a bit line coupled to a column of memory cells in the memory device and to output a first bias voltage based on the first read voltage and associated current on the bit line and a second bias voltage based on the second read voltage and associated current on the bit line;
a first capacitor including a first terminal coupled to output of the bias circuitry and a second terminal;
a first amplifier including an inverting input coupled to the second terminal of the first capacitor and a non-inverting input coupled to a common mode voltage during the first phase of the read operation and to a reference voltage during the second phase of the read operation;
a second capacitor including a first terminal coupled to an output of the first amplifier and a second terminal;
a second amplifier including an inverting input coupled to the second terminal of the second capacitor and a non-inverting input coupled to a common mode voltage.

20. The memory device of claim 19, wherein:
the second terminal of the first capacitor is also coupled to the output of the first amplifier only during the first phase of the read operation; and
the second terminal of the second capacitor is also coupled to the output of the second amplifier only during the first phase of the read operation.

* * * * *